(12) United States Patent
Ham et al.

(10) Patent No.: US 11,659,665 B2
(45) Date of Patent: May 23, 2023

(54) CONNECTION STRUCTURE EMBEDDED SUBSTRATE

(71) Applicant: SAMSUNG ELECTRO-MECHANICS CO., LTD., Suwon-si (KR)

(72) Inventors: Ho Hyung Ham, Suwon-si (KR); Won Seok Lee, Suwon-si (KR); Jae Sung Sim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 102 days.

(21) Appl. No.: 17/217,264

(22) Filed: Mar. 30, 2021

(65) Prior Publication Data
US 2022/0210921 A1    Jun. 30, 2022

(30) Foreign Application Priority Data

Dec. 28, 2020    (KR) .......................... 10-2020-0184112

(51) Int. Cl.
*H05K 1/18*    (2006.01)
*H01L 23/538*    (2006.01)
*H05K 1/11*    (2006.01)

(52) U.S. Cl.
CPC ......... *H05K 1/186* (2013.01); *H01L 23/5383* (2013.01); *H01L 23/5385* (2013.01); *H05K 1/119* (2013.01); *H05K 1/181* (2013.01); *H05K 2201/068* (2013.01); *H05K 2201/09827* (2013.01); *H05K 2201/10378* (2013.01); *H05K 2201/10522* (2013.01)

(58) Field of Classification Search
CPC ....................................................... H05K 1/186
USPC ........................................................... 361/784
See application file for complete search history.

(56) References Cited

U.S. PATENT DOCUMENTS

| | | | |
|---|---|---|---|
| 2012/0129298 A1* | 5/2012 | Lin | ........................ H01L 24/20 438/118 |
| 2014/0246227 A1* | 9/2014 | Lin | ...................... H05K 3/4697 174/266 |
| 2017/0271264 A1 | 9/2017 | Lee | |
| 2020/0243450 A1 | 7/2020 | Cho et al. | |
| 2021/0282266 A1* | 9/2021 | Noto | .................... H05K 3/4673 |
| 2022/0199480 A1* | 6/2022 | Karhade | ................. H01L 24/33 |

FOREIGN PATENT DOCUMENTS

| | | |
|---|---|---|
| KR | 10-2132299 B1 | 7/2020 |
| KR | 10-2020-0092236 A | 8/2020 |

* cited by examiner

*Primary Examiner* — Stanley Tso
(74) *Attorney, Agent, or Firm* — Morgan, Lewis & Bockius LLP

(57) ABSTRACT

A connection structure-embedded substrate includes: a printed circuit board including a plurality of first insulating layers of which at least one has a cavity provided therein, a plurality of first wiring layers disposed as at least one of an outer portion and an inner portion of the plurality of first insulating layers, and a first build-up insulating layer disposed on an upper surface of the plurality of first insulating layers; and a connection structure at least partially disposed in the cavity. The first build-up insulating layer is disposed in the cavity, and each of a lower surface of the connection structure and a lower surface of the cavity is in contact with at least a portion of the first build-up insulating layer, respectively.

23 Claims, 8 Drawing Sheets

A

CONNECTION STRUCTURE EMBEDDED SUBSTRATE

CROSS-REFERENCE TO RELATED APPLICATION(S)

This application claims benefit of priority to Korean Patent Application No. 10-2020-0184112 filed on Dec. 28, 2020 in the Korean Intellectual Property Office, the disclosure of which is incorporated herein by reference in its entirety.

TECHNICAL FIELD

The present disclosure relates to a connection structure-embedded substrate.

BACKGROUND

In accordance with performance improvements of printed circuit board (PCB) products, thinness and circuit wiring microminiaturization characteristics of such PCB products have been continuously required. In particular, in accordance with performance improvements of an application specific integrated circuit (ASIC) and a high-bandwidth memory (HBM), a circuit line width of a PCB product group has also become fine. Therefore, a substrate structure in which a connection structure capable of directly connecting the ASIC and the HBM to each other is embedded has been continuously proposed.

Recently, in the electronic components industry, highly-integrated PCBs have been required in order to cope with 5G high-speed communications and artificial intelligence (AI). A microcircuit is a core technology for highly-integrated PCBs, and research into and development of the microcircuit have currently been actively conducted in the industry, but an increase in costs caused by a decrease in yield in the manufacturing of a substrate due to multiple layers and a large area has become a problem. Therefore, a technology of separately manufacturing the microcircuit for a region requiring the microcircuit in a connection structure form and embedding the manufactured microcircuit in a large-area substrate is being developed, and a representative example of such a technology may include an embedded multi-die interconnect bridge (EMIB) technology.

Meanwhile, in a case of the EMIB technology, after a cavity is formed in a PCB, the connection structure needs to be fixed to a stopper metal using an adhesive attached to the connection structure so that the connection structure may be fixed without moving in a post process. In this case, an additional process for forming the cavity is required, and the adhesive used for bonding the connection structure, such as a die attach film (DAF), has a short lifespan and is expensive, such that it may be difficult to manage the lifespan of the adhesive, which may cause an increase in costs.

SUMMARY

An aspect of the present disclosure may provide a connection structure-embedded substrate in which a connection structure may be embedded in a board without using a separate adhesive for bonding the connection structure.

Another aspect of the present disclosure may provide a connection structure-embedded substrate having improved warpage control characteristics.

Another aspect of the present disclosure may provide a connection structure-embedded substrate in which electrical characteristics at the time of a die-to-die high-speed signal transmission may be improved.

According to an aspect of the present disclosure, a connection structure-embedded substrate may include: a printed circuit board including a plurality of first insulating layers of which at least one has a cavity provided therein, a plurality of first wiring layers disposed as at least one of an outer portion and an inner portion of the plurality of first insulating layers, and a first build-up insulating layer disposed on an upper surface of the plurality of first insulating layers; and a connection structure at least partially disposed in the cavity. The first build-up insulating layer may be disposed in the cavity, and each of a lower surface of the connection structure and a lower surface of the cavity may be in contact with at least a portion of the first build-up insulating layer, respectively.

According to another aspect of the present disclosure, a connection structure-embedded substrate may include: a printed circuit board including a first insulating body having a cavity provided in at least a portion thereof, a plurality of first wiring layers disposed on at least one of an outer portion and an inner portion of the first insulating body, a first build-up insulating layer disposed on the first insulating body, and a second build-up insulating layer disposed on the first build-up insulating layer; and a connection structure at least partially embedded in the cavity and including a second insulating body and a plurality of second wiring layers disposed on at least one of an outer portion and an inner portion of the second insulating body. The first build-up insulating layer may be disposed in the cavity, and the first and second build-up insulating layers may include different insulating materials.

According to another aspect of the present disclosure, a connection structure-embedded substrate may include: a printed circuit board including insulating layers and wiring layers disposed in or on the insulating layers, one of the insulating layers having a cavity extending from an upper surface of the one of the insulating layers; and a connection structure at least partially disposed in the cavity, and including an upper surface, a lower surface opposing the upper surface, and a side surface connected to the upper surface and the lower surface of the connection structure. The printed circuit board further includes a first build-up insulating layer covering a portion of the upper surface of the one of the insulating layer, and the side surface and the lower surface of the connection structure, and the upper surface of the connection structure is exposed from the first build-up insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
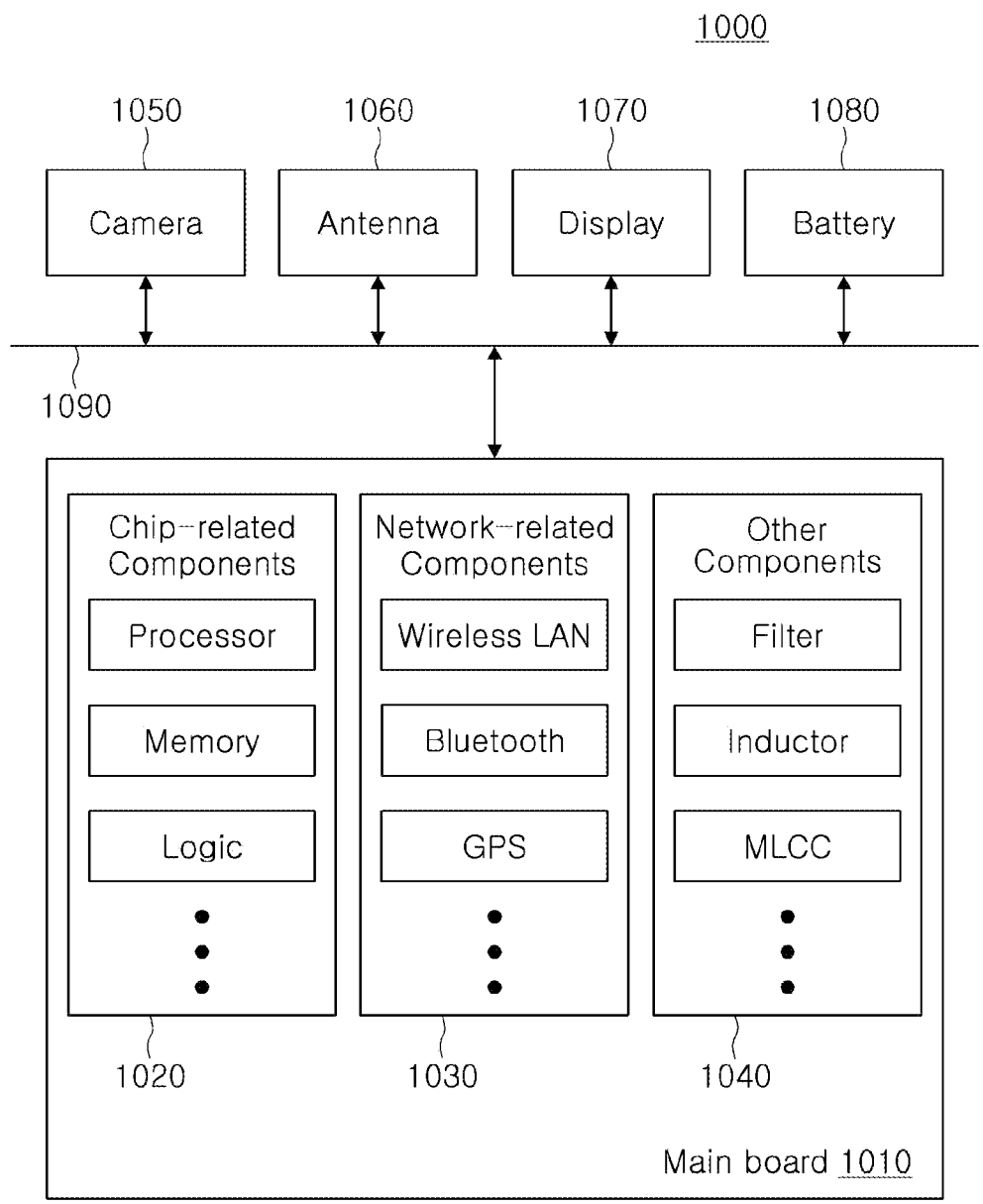
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

Herein, expressions such as a side portion and a side surface are used to refer to a left/right direction or a surface in the left/right direction in the drawings for convenience, expressions such as an upper side, an upper portion, and an upper surface are used to refer to an upward direction or a surface in the upward direction in the drawings for convenience, and expressions such as a lower side, a lower portion, and a lower surface are used to refer to a downward direction or a surface in the downward direction in the drawings for convenience. In addition, "positioned on the side portion, on the upper side, above, on the lower side, or below" conceptually includes a case in which a target component is positioned in a corresponding direction, but does not be in direct contact with a reference component, as well as a case in which the target component is in direct contact with the reference component in the corresponding direction. However, these directions are defined for convenience of explanation, and the claims are not particularly limited by the directions defined as described above, and concepts of upper and lower portions may be exchanged with each other at any time.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-digital converter (ADC), an application-specific integrated circuit (ASIC), or the like. However, these chip related components 1020 are not limited thereto, and may also include other types of chip related components. In addition, these chip related components may be combined with each other. These chip related components 1020 may have a package form including the chips described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, these network related components 1030 may be combined with the chip related components 1020 to be provided in a package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, these other components 1040 may be combined with the chip related components 1020 and/or the network related components 1030 to be provided in a package form.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
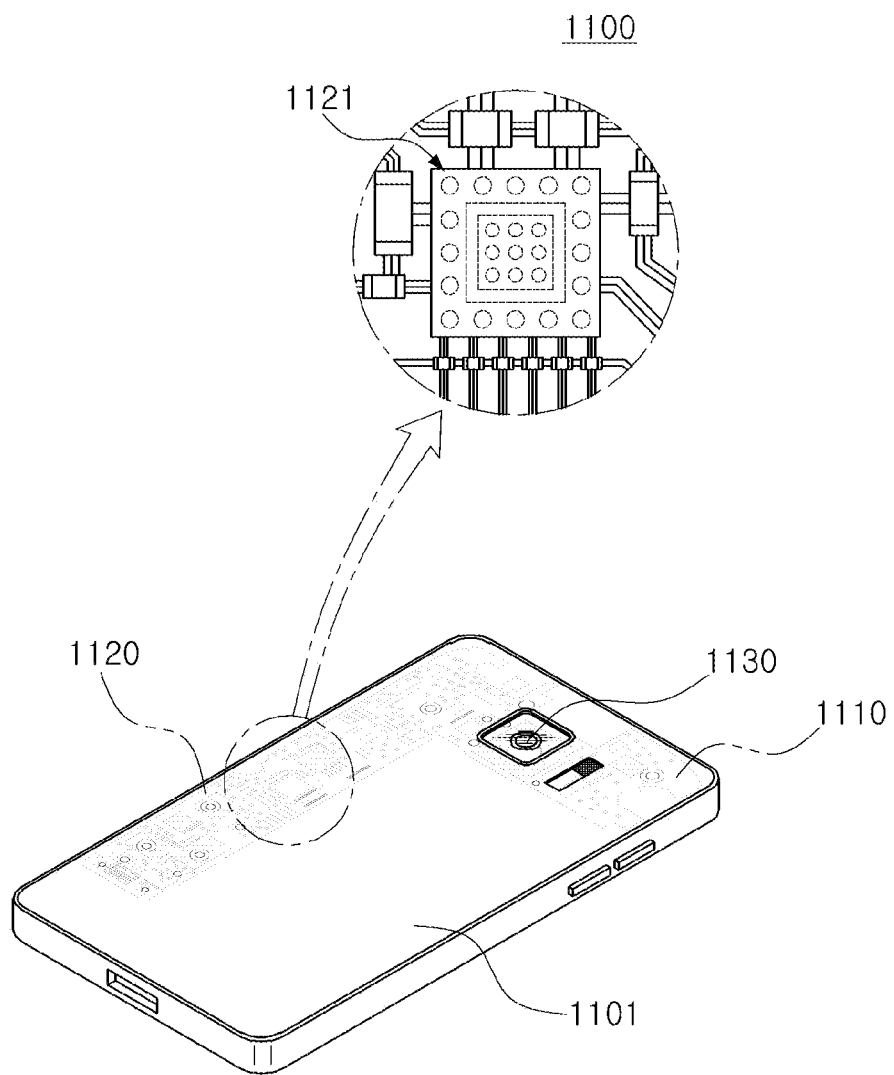
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various electronic components 1120 may be physically or electrically connected to the motherboard 1110. In addition, a camera module 1130 and/or a speaker may be accommodated in the motherboard 1110. Some of the electronic components 1120 may be the chip related components described above, such as a connection structure-embedded substrate 1121 having a plurality of electronic components mounted on a surface thereof, but are not limited thereto. Meanwhile, the electronic device is not necessarily limited to the smartphone 1100, but may be other electronic devices as described above.

Figure 3:
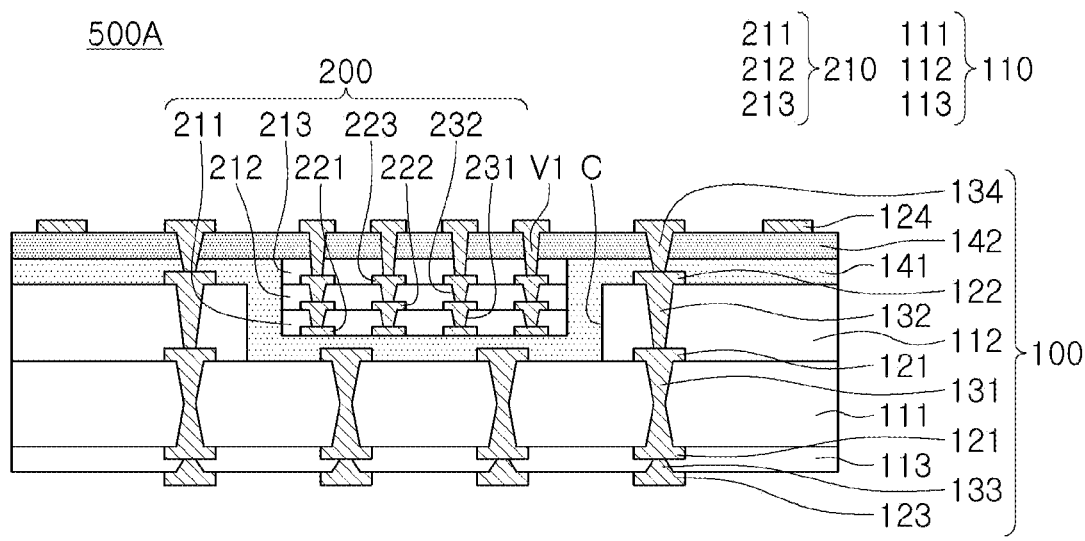
FIG. 3 is a schematic cross-sectional view illustrating an example of a connection structure-embedded substrate.

FIG. 3 is a schematic cross-sectional view illustrating an example of a connection structure-embedded substrate.

Referring to FIG. 3, a connection structure-embedded substrate 500A according to an exemplary embodiment may include a printed circuit board 100 including a first insulating body 110 including a plurality of first insulating layers 111, 112, and 113, first and second build-up insulating layers 141 and 142 disposed on the first insulating body 110, a plurality of first wiring layers 121, 122, 123, and 124 disposed as at least one of an outer portion and an inner portion of the first insulating body 110, and a plurality of first via layers 131, 132, 133, and 134 disposed in the first insulating body 110 and the first and second build-up insulating layers 141 and 142; and a connection structure 200 including a second insulating body 210 embedded in the first and second build-up insulating layers 141 and 142 and including a plurality of second insulating layers 211, 212, and 213, a plurality of second wiring layers 221, 222, and 223 disposed as at least one of an outer portion and an inner portion of the second insulating body 210, and a plurality of second via layers 231 and 232 disposed in the second insulating body 210. The respective first insulating layers 111, 112, and 113 of the first insulating body 110, the first and second build-up insulating layers 141 and 142, and the respective second insulating layers 211, 212, and 213 of the second insulating body 210 may include an insulating resin. At least a portion of the connection structure 200 may be embedded in a cavity C, and the first and second build-up insulating layers 141 and 142 may include different insulating materials, respectively.

As such, the connection structure-embedded substrate 500A according to an exemplary embodiment may have a structure in which at least a portion of the connection structure 200 is embedded in the cavity C of the printed circuit board 100. In addition, the connection structure 200 may be bonded to the printed circuit board 100 without using a separate adhesive. For example, a lower surface of the second insulating body 210 of the connection structure 200 may be in contact with the first build-up insulating layer 141. Therefore, the problems in the printed circuit board in which the EMIB according to the related art described above is embedded may be solved.

Meanwhile, the lower surface of the second insulating body 210 of the connection structure 200 may be in contact with the first build-up insulating layer 141 of the printed circuit board 100. The first build-up insulating layer 141 may be disposed to fill a surplus space in the cavity C through a high-temperature compression process after the connection structure 200 is disposed in the cavity C. To this end, the first build-up insulating layer 141 may include a material having fluidity at a high temperature. The connection structure 200 may be in contact with the first build-up insulating layer 141 filling the cavity C, and the first build-up insulating layer 141 may surround the connection structure 200 and fill an inner portion of the cavity C. Resultantly, a structure in which a recessed surface of the first build-up insulating layer 141 and the connection structure 200 are in contact with each other may be derived.

When the first build-up insulating layer 141 includes an insulating material in a B-stage such as an Ajinomoto Build Up film (ABF) before filling the cavity C, if a precursor 141' of the first build-up insulating layer 141 is disposed and is then hardened through a hardening process, the first build-up insulating layer 141 may be fixed. On the other hand, when the first build-up insulating layer 141 includes a prepreg or the like that has already been hardened, a separate hardening treatment may not be required, and the prepreg may have fluidity in a high-temperature environment and flow into the cavity C to fill the cavity C and surround the connection structure 200. As a result, a separate adhesive for fixing the connection structure 200 may be omitted, and a lower surface of the cavity C and a lower surface of the connection structure 200 may be disposed to be spaced apart from each other.

Therefore, according to the connection structure-embedded substrate 500A according to an exemplary embodiment in the present disclosure, a space on the lower surface of the cavity C may be secured, such that a wiring layer or a circuit pattern may be disposed on the lower surface of the cavity (C), and a degree of freedom in design may thus be secured.

Since the first build-up insulating layer 141 fills the inner portion of the cavity C and surrounds the connection structure 200 in a B-stage, a partially hardened state, or a state having fluidity in a high temperature environment, the first build-up insulating layer 141 may be partially recessed inwardly, and the connection structure 200 may be disposed in the recessed region. Therefore, after the hardening process, an upper surface of a 1-3-th insulating layer 113 may have a step in a region in contact with the lower surface of the second insulating body 210 of the connection structure 200.

Meanwhile, the first build-up insulating layer 141 may include an organic insulating material capable of being semi-hardened or partially hardened, or may include a material having fluidity at a high temperature. For example, the first build-up insulating layer 141 may include an ABF or a prepreg, but is not limited thereto. The first build-up insulating layer 141 may fill the cavity C in the B-stage or the partially hardened state or may flow into the cavity C in a high temperature environment to fill the surplus space in the cavity C. As a result, the connection structure 200 may be stably fixed in the cavity C without using an adhesive.

Meanwhile, the second build-up insulating layer 142 may be disposed on the first build-up insulating layer 141. The connection structure 200 may be disposed at at least a portion of the cavity C, and may have a structure in which an upper surface thereof is exposed from one surface of the first build-up insulating layer 141. In this case, the exposed upper surface of the connection structure 200 may be coplanar with one surface of the first build-up insulating layer 141. Here, "coplanar" may mean that the upper surface of the connection structure 200 and one surface of the first build-up insulating layer 141 are horizontal to each other as a whole or the upper surface of the connection structure 200 and the one surface of the first build-up insulating layer 141 have a structure in which they are disposed to be connected continuously to each other or a structure similar thereto even though the upper surface of the connection structure 200 and the one surface of the first build-up insulating layer 141 are not horizontal to each other as a whole. The second build-up insulating layer 142 may be disposed on the first build-up insulating layer 141 to cover the exposed upper surface of the connection structure 200.

When the first build-up insulating layer 141 includes the organic insulating material capable of being semi-hardened or partially hardened or includes the material having the fluidity at the high temperature, as described above, the first build-up insulating layer 141 may have a high coefficient of thermal expansion (CTE), and a warpage problem of the internal substrate 500A of the connection structure may occur accordingly. In order to prevent such a problem, the second build-up insulating layer 142 may include a material having a coefficient of thermal expansion lower than that of the first build-up insulating layer 141.

Therefore, the second build-up insulating layer 142 may include a material different from that of the first build-up insulating layer 141, and may include a material having a coefficient of thermal expansion relatively lower than that of the first build-up insulating layer 141.

The first build-up insulating layer 141 may be formed of the material having the fluidity at the high temperature in order to fill the inner portion of the cavity C, and may thus include a material having a high CTE. Therefore, in order to compensate for the high CTE of the first build-up insulating layer 141, the second build-up insulating layer 142 may be configured to include a material having a relatively low CTE. As a result, a difference in CTE from a wiring layer or a via may be reduced, and occurrence of warpage of the entire connection structure-embedded substrate 500A may thus be alleviated.

Meanwhile, the second build-up insulating layer 142 may include the same material as the first build-up insulating layer 141. For example, the second build-up insulating layer 142 may also include a prepreg. In this case, the second build-up insulating layer 142 may include fillers 144 disposed therein in order to have a coefficient of thermal expansion lower than that of the first build-up insulating layer 141. When the first and second build-up insulating layers 141 and 142 include fillers, the fillers 143 and 144 may be fillers including any material having a low CTE, such as fillers including silica.

The fillers 144 may be dispersed and disposed in an insulating resin. Meanwhile, the first build-up insulating layer 141 may also include fillers 143 disposed therein. In this case, a content of the fillers 144 per unit volume of the second build-up insulating layer 142 may be larger than that of the fillers 143 per unit volume of the first build-up insulating layer 141. Therefore, a density of the fillers 144 in the second build-up insulating layer 142 may be higher than that of the fillers 143 in the first build-up insulating layer 141.

In a description of the present disclosure, "density" may be a volume occupied by a corresponding component within a unit volume, rather than simply a density (volume/mass) of a physical term. In other words, "density" may correspond to a volume ratio of the corresponding component to another component to which the corresponding component belongs. Alternatively, "density" may refer to a packing factor when the corresponding configuration is compared with another configuration to which the corresponding configuration belongs. In another example, "density" may be an area occupied by a corresponding component within a unit area in a cross-section. In other words, "density" may correspond to an area ratio of the corresponding component to another component to which the corresponding component belongs. The cross-section may cross or be perpendicular to a main surface such as an upper surface or a lower surface of the connection structure-embedded substrate.

Meanwhile, the second build-up insulating layer 142 may have a dissipation factor (Df) lower than that of the first build-up insulating layer 141. The second build-up insulating layer 142 may be disposed on the first build-up insulating layer 141, and may thus be disposed closer to a plurality of electronic components 310 and 320 to be described later than the first build-up insulating layer 141 is. Therefore, since the second build-up insulating layer 142 has a low dissipation factor (Df), when a plurality of electronic components or dies 310 and 320 are mounted on the printed circuit board, electrical characteristics at the time of die-to-die high-speed signal transmission may be further improved.

The connection structure 200 may be disposed in the cavity C so that a 2-1-th wiring layer 221 is positioned on the lower surface of the cavity C. The connection structure 200 may include the plurality of second insulating layers 211, 212, and 213, the plurality of second wiring layers 221, 222, and 223, and the plurality of second via layers 231 and 232. Meanwhile, the plurality of second wiring layers 221, 222, and 223 may also be disposed as at least one of the outer portion and the inner portion of the second insulating body 210.

The plurality of second wiring layers 221, 222, and 223 of the connection structure 200 may include high-density circuits having a relatively higher density than the plurality of first wiring layers 121, 122, 123, and 124 of the printed circuit board 100. Here, the high density may refer to a relatively finer pitch and/or a relatively smaller interval.

As an example of the high-density circuits, the plurality of second wiring layers 221, 222, and 223 of the connection structure 200 may have a relatively finer pitch than the plurality of first wiring layers 121, 122, 123, and 124 of the printed circuit board 100.

Here, the pitch may refer to a distance from the center of any one conductor pattern to the center of another conductor pattern adjacent to any one conductor pattern on each wiring layer disposed on the same layer. In addition, in the present disclosure, the pitches of the plurality of first wiring layers 121, 122, 123, and 124 and the plurality of second wiring layers 221, 222, and 223 may refer to average values of pitches of each of the wiring layers rather than pitches of each of the wiring layers. That is, the meaning that the plurality of second wiring layers 221, 222, and 223 of the connection structure 200 have the relatively finer pitch than the plurality of first wiring layers 121, 122, 123, and 124 of the printed circuit board 100 is that an average value of each pitch in the plurality of second wiring layers 221, 222, and 223 may be smaller than that of each pitch in the plurality of first wiring layers 121, 122, 123, and 124.

For example, a first pitch may be greater than a second pitch in which the first pitch is an average pitch of at least one of the plurality of first wiring layers 121, 122, 123, and 124 of the printed circuit board 100, and the second pitch is an average pitch of at least one of the plurality of second wiring layers 221, 222, and 223 of the connection structure 200.

As another example of the high-density circuits, a first interval may be greater than a second interval in which the first interval is an average between the plurality of first wiring layers 121, 122, 123, and 124 of the printed circuit board 100, and the second interval is an interval between the plurality of second wiring layers 221, 222, and 223 of the connection structure 200. Here, the interval may refer to an interval between respective wiring layers in the plurality of first wiring layers 121, 122, 123, and 124 and the plurality of second wiring layers 221, 222, and 223.

Meanwhile, a 1-4-th wiring layer 124 disposed at the uppermost side among the plurality of first wiring layers 121, 122, 123, and 124 of the printed circuit board 100 may be connected to a 2-3-th wiring layer 223 disposed at the uppermost side among the plurality of second wiring layers 221, 222, and 223 of the connection structure 200 through a wiring via V1 penetrating through both of the second build-up insulating layer 142 disposed on the first insulating body 110 of the printed circuit board 100 and a 2-3-th insulating layer 213 disposed at the uppermost side of the second insulating body 210 of the connection structure 200.

Meanwhile, at least a portion of any one layer of the plurality of first wiring layers 121, 122, 123, and 124 may be disposed on the lower surface of the cavity C. Referring to FIG. 3, at least a portion of a 1-1-th wiring layer 121 may be disposed on the lower surface of the cavity C, and may be disposed between the connection structure 200 and the lower surface of the cavity C. In addition, the 1-1-th wiring layer 121 disposed in the cavity C may be spaced apart from the lower surface of the connection structure 200 by a predetermined distance in a stacked direction. Therefore, the 1-1-th wiring layer 121 and the connection structure 200 may be indirectly connected to each other, and may not be directly connected to each other by the first build-up insulating layer 141. Therefore, the first build-up insulating layer 141 may cover an upper surface and side surfaces of the 1-1-th wiring layer 121 protruding into the cavity C.

Meanwhile, the 2-1-th wiring layer 221 disposed at the lowermost side among the plurality of second wiring layers 221, 222, and 223 of the connection structure 200 may be embedded at a lower side of a 2-1-th insulating layer 211 disposed at the lowermost side of the plurality of second insulating layers 211, 212, and 213, and a lower surface of the 2-1-th wiring layer 221 may be exposed. The exposed lower surface of the 2-1-th wiring layer 221 disposed at the lowermost side of the connection structure 200 may be in contact with and be covered by the first build-up insulating layer 141 of the printed circuit board 100 described above.

Hereinafter, components of the connection structure-embedded substrate 500A according to an exemplary embodiment will be described with reference to the accompanying drawings.

In the connection structure-embedded substrate 500A according to an exemplary embodiment illustrated in FIG. 3, the printed circuit board 100 may include the first insulating body 110 including the plurality of first insulating layers 111, 112, and 113, the first and second build-up insulating layers 141 and 142 disposed on the first insulating body 110, the plurality of first wiring layers 121, 122, 123, and 124, and the plurality of first via layers 131, 132, 133, and 134. The plurality of first wiring layers 121, 122, 123, and 124 may include conductor patterns, respectively, and the plurality of first via layers 131, 132, 133, and 134 may electrically connect the conductor patterns of the plurality of first wiring layers 121, 122, 123 and 124 described above each other.

The first insulating body 110 of the printed circuit board 100 may have a form having a core layer. For example, the printed circuit board 100 may include a 1-1-th insulating layer 111 functioning as the core layer of the first insulating body 110, 1-1-th wiring layers 121 disposed on one surface and the other surface of the 1-1-th insulating layer 111, a 1-1-th via layer 131 penetrating through the 1-1-th insulating layer 111 and connecting the 1-1-th wiring layers 121 to each other, a 1-2-th insulating layer 112 disposed on one surface of the 1-1-th insulating layer 111 to cover the 1-1-th wiring layer 121, a 1-2-th wiring layer 122 disposed on one surface of the 1-2-th insulating layer 112, a 1-2-th via layer 132 penetrating through the 1-2-th insulating layer 112 and connecting the 1-1-th wiring layer 121 and the 1-2-th wiring layer 122 to each other, the 1-3-th insulating layer 113 disposed on the other surface of the 1-1-th insulating layer 111 to cover the 1-1-th wiring layer 121, a 1-3-th wiring layer 123 disposed on the 1-3-th insulating layer 113, a 1-3-th via layer 133 penetrating through the 1-3-th insulating layer 113 and connecting the 1-1-th wiring layer 121 and the 1-3-th wiring layer 123 to each other, the first build-up insulating layer 141 disposed on the 1-2-th insulating layer 112 and covering the 1-2-th wiring layer 122, the second build-up insulating layer 142 disposed on the first build-up insulating layer 141, the 1-4-th wiring layer 124 disposed on the second build-up insulating layer 142, a 1-4-th via layer 134 penetrating through the first and second build-up insulating layers 141 and 142 and connecting the 1-2-th wiring layer 122 and the 1-4-th wiring layer 124 to each other, and the wiring via V1 penetrating through the second build-up insulating layer 142 and the 2-3-th insulating layer 213 and connecting the 1-4-th wiring layer 124 and the 2-3-th wiring layer 223 to each other. In one example, the wiring via V1 and the 1-4-th via layer 134 may have a tapered shape tapered in a direction the same as the 1-2-th via layer 132 in the 1-2-th insulating layer 112. The wiring via V1 and the 1-4-th via layer 134 may have a tapered shape tapered in a direction the same as the plurality of second via layers 231 and 232. For example, an upper side of the wiring via V1 or the 1-4-th via layer 134 may have a width greater than a width of a lower side of the wiring via V1 or the 1-4-th via layer 134.

A material of each of the plurality of first insulating layers 111, 112, and 113 may be an insulating material. In this case, the insulating material may be a thermosetting resin such as an epoxy resin, a thermoplastic resin such as a polyimide resin, and a resin having a reinforcement material such as an inorganic filler such as silica and/or a glass fiber included in the thermosetting resin and the thermoplastic resin, for example, a prepreg, an ABF, or the like. The 1-1-th insulating layer 111 may have a thickness greater than those of the 1-2-th insulating layer 112 and the 1-3-th insulating layer 113. The number of layers of the plurality of first insulating layers 111, 112, and 113 may be more than that illustrated in the drawing or less than that illustrated in the drawing.

The first and second build-up insulating layers 141 and 142 may include the same material or include different materials.

When the first and second build-up insulating layers 141 and 142 include the same material, a material of each of the first and second build-up insulating layers 141 and 142 may be an insulating material. In this case, the insulating material may be a thermosetting resin such as an epoxy resin, a thermoplastic resin such as a polyimide resin, and a resin having a reinforcement material such as an inorganic filler such as silica and/or a glass fiber included in the thermosetting resin and the thermoplastic resin, for example, a prepreg, an ABF, or the like. In this case, the first build-up insulating layer 141 may include a material having fluidity in a high-temperature environment, and the first and second build-up insulating layers 141 and 142 may have different dielectric constants. For example, the second build-up insulating layer 142 may have a coefficient of thermal expansion (CTE) lower than that of the first build-up insulating layer 141, and may have a dissipation factor (Df) and a dielectric constant (Dk) lower than those of the first build-up insulating layer 141.

The first build-up insulating layer 141 may be formed of the material having the fluidity at the high temperature in order to fill the inner portion of the cavity C, and may thus include a material having a high CTE. Therefore, in order to compensate for the high CTE of the first build-up insulating layer 141, the second build-up insulating layer 142 may be configured to include a material having a relatively low CTE. As a result, a difference in CTE from a wiring layer or a via may be reduced, and occurrence of warpage of the entire connection structure-embedded substrate 500A may thus be alleviated.

Meanwhile, the second build-up insulating layer 142 may be disposed on the first build-up insulating layer 141, and may thus be disposed closer to a plurality of electronic components 310 and 320 to be described later than the first build-up insulating layer 141 is. In addition, the wiring via V1 connecting the connection structure 200 and the electronic components 310 and 320 to each other may be disposed to penetrate through the second build-up insulating layer 142. As such, the second build-up insulating layer 142 may be closely related to electrical signal transfer between the connection structure 200 and the electronic components 310 and 320 and may have a direct influence on a signal transfer path. Therefore, the second build-up insulating layer 142 may prevent loss of signals at the time of transferring the signals, and make signal characteristics excellent at the time of transferring radio frequency signals by having a low dissipation factor (Df) and a low dielectric constant (Dk). Therefore, the second build-up insulating layer 142 and may be designed to have a dissipation factor (Df) and a dielectric constant (Dk) lower than those of the first build-up insulating layer 141.

For example, when the first build-up insulating layer 141 includes an ABF, the second build-up insulating layer 142 may include a low Df/Dk ABF of which both of a dissipation factor (Df) and a dielectric constant (Dk) are low. As such, the first and second build-up insulating layers 141 and 142 may include the same materials, but physical properties of the materials of the first and second build-up insulating layers 141 and 142 may be different from each other.

As another example, the first build-up insulating layer 141 may include the fillers 143 disposed in an insulating resin. In this case, the second build-up insulating layer 142 may also include the fillers 144 disposed in the insulating resin. In this case, a content of the fillers 144 per unit volume of the second build-up insulating layer 142 may be larger than that of the fillers 143 per unit volume of the first build-up insulating layer 141. In another example, a content of the fillers 144 per unit area of the second build-up insulating layer 142 may be larger than that of the fillers 143 per unit area of the first build-up insulating layer 141.

Meanwhile, when the first and second build-up insulating layers 141 and 142 include different materials, the second build-up insulating layer 142 may include a material having a CTE, a Df, or a Dk relatively lower than that of the first build-up insulating layer 141.

A material of each of the plurality of first wiring layers 121, 122, 123, and 124 may be a metal material such as copper (Cu), aluminum (Al), silver (Ag), tin (Sn), gold (Au), nickel (Ni), lead (Pb), titanium (Ti), or alloys thereof. The plurality of first wiring layers 121, 122, 123, and 124 may perform various functions depending on a design, respectively. For example, the plurality of first wiring layers 121, 122, 123, and 124 may include ground patterns, power patterns, signal patterns, and the like. These patterns may have a line, plane, or pad form, respectively. Each of plurality of first wiring layers 121, 122, 123, and 124 may be formed by a plating process such as an additive process (AP), a semi-additive process (SAP), a modified semi-additive process (MSAP), tenting (TT), or the like, and may resultantly include a seed layer, which is an electroless plating layer, and an electroplating layer formed on the basis of the seed layer. Each of plurality of first wiring layers 121, 122, 123, and 124 may further include a primer copper foil, if necessary. The number of layers of the plurality of first wiring layers 121, 122, 123, and 124 may be more than that illustrated in the drawing or less than that illustrated in the drawing.

A material of each of the plurality of first via layers 131, 132, 133, and 134 may be a metal material such as copper (Cu), aluminum (Al), silver (Ag), tin (Sn), gold (Au), nickel (Ni), lead (Pb), titanium (Ti), or alloys thereof. The plurality of first via layers 131, 132, 133, and 134 may also include signal connection vias, ground connection vias, power connection vias, and the like, according to a design, respectively. Each of wiring vias of the plurality of first via layers 131, 132, 133, and 134 may be completely filled with the metal material or the metal material may be formed along a wall of a via hole. Each of the plurality of first via layers 131, 132, 133, and 134 may have a tapered shape. Each of the plurality of first via layers 131, 132, 133, and 134 may also be formed by a plating process such as an AP, an SAP, an MSAP, TT, or the like, and may resultantly include a seed layer, which is an electroless plating layer, and an electroplating layer formed on the basis of the seed layer. The number of layers of the plurality of first via layers 131, 132, 133, and 134 may be more than that illustrated in the drawing or less than that illustrated in the drawing.

The connection structure 200 may include the second insulating body 210 including the plurality of second insulating layers 211, 212, and 213, the plurality of second wiring layers 221, 222, and 223, and the plurality of second via layers 231 and 232. The plurality of second wiring layers 221, 222, and 223 may include conductor patterns, respectively, and the plurality of second via layers 231 and 232 may electrically connect the conductor patterns to each other. The connection structure 200 may have a coreless substrate form. For example, the connection structure 200 may include the 2-1-th insulating layer 211, the 2-1-th wiring layer 221 embedded at a lower side of the 2-1-th insulating layer 211, a 2-2-th wiring layer 222 disposed on an upper surface of the 2-1-th insulating layer 211, a 2-1-th via layer 231 penetrating through the 2-1-th insulating layer 211 and connecting the 2-1-th wiring layer 221 and the 2-2-th wiring layer 222 to each other, a 2-2-th insulating layer 212 disposed on the upper surface of the 2-1-th insulating layer 211 and covering the 2-2-th wiring layer 222, a 2-3-th wiring layers 223 disposed on an upper surface of the 2-2-th insulating layer 212, a 2-2-th via layer 232 penetrating through the 2-2-th insulating layer 212 and connecting the 2-2-wiring layer 222 and the 2-3-th wiring layer 223 to each other, and the 2-3-th insulating layer 213 is disposed on the upper surface of the 2-2-th insulating layer 212 and covers the 2-3-th wiring layer 223.

The connection structure 200 may be attached to one surface of a tape T together with the precursor 141' of the first build-up insulating layer 141 in a state in which it is disposed on a carrier 710 as described later, and be then disposed in the cavity C of a precursor of the printed circuit board 100. Thereafter, the precursor 141' of the first build-up insulating layer 141 may melt at a high temperature to fill the cavity C, such that the connection structure 200 may be fixed with at least a portion thereof embedded in the cavity C.

A material of each of the plurality of second insulating layers 211, 212, and 213 may be an insulating material. The insulating material of each of the 2-1-th to 2-3-th insulating layers 211 to 213 may be, for example, a general insulating material such as an insulating resin such as an ABF, polyimide, an epoxy resin, or a prepreg containing a glass fiber or a filler disposed in the insulating resin, or a photo-imagable dielectric (PID) or the like, which is a photosensitive insulating material. The number of layers of the plurality of second insulating layers 211, 212, and 213 may be more than that illustrated in the drawing or less than that illustrated in the drawing.

A material of each of the plurality of second wiring layers 221, 222, and 223 may be a metal material such as copper (Cu), aluminum (Al), silver (Ag), tin (Sn), gold (Au), nickel (Ni), lead (Pb), titanium (Ti), or alloys thereof. The plurality of second wiring layers 221, 222, and 223 may perform various functions depending on a design, respectively. For example, the plurality of second wiring layers 221, 222, and 223 may include ground patterns, power patterns, signal patterns, and the like. These patterns may have a line, plane, or pad form, respectively. Each of the plurality of second wiring layers 221, 222, and 223 may also be formed by a plating process such as an AP, an SAP, an MSAP, TT, or the like, and may resultantly include a seed layer, which is an electroless plating layer, and an electroplating layer formed on the basis of the seed layer. Each of plurality of second wiring layers 221, 222, and 223 may further include a primer copper foil, if necessary. The number of layers of the plurality of second wiring layers 221, 222, and 223 may be more than that illustrated in the drawing or less than that illustrated in the drawing.

A material of each of the plurality of second via layers 231 and 232 may be a metal material such as copper (Cu), aluminum (Al), silver (Ag), tin (Sn), gold (Au), nickel (Ni), lead (Pb), titanium (Ti), or alloys thereof. The plurality of second via layers 231 and 232 may also include signal connection vias, ground connection vias, power connection vias, and the like, according to a design, respectively. Each of wiring vias of the plurality of second via layers 231 and 232 may be completely filled with the metal material or the metal material may be formed along a wall of a via hole. Each of the plurality of second via layers 231 and 232 may have a tapered shape. Each of the plurality of second via layers 231 and 232 may also be formed by a plating process such as an AP, an SAP, an MSAP, TT, or the like, and may resultantly include a seed layer, which is an electroless plating layer, and an electroplating layer formed on the basis of the seed layer. The number of layers of the plurality of second via layers 231 and 232 may be more than that illustrated in the drawing or less than that illustrated in the drawing.

The plurality of second wiring layers 221, 222, and 223 of the connection structure 200 may include high-density circuits having a relatively higher density than the plurality of first wiring layers 121, 122, 123, and 124 of the printed circuit board 100. Here, the high density may refer to a relatively finer pitch and/or a relatively smaller interval.

As an example of the high-density circuits, the plurality of second wiring layers 221, 222, and 223 of the connection structure 200 may have a relatively finer pitch than the plurality of first wiring layers 121, 122, 123, and 124 of the printed circuit board 100.

Here, the pitch may refer to a distance from the center of any one conductor pattern to the center of another conductor pattern adjacent to any one conductor pattern on each wiring layer disposed on the same layer. In addition, in the present disclosure, the pitches of the plurality of first wiring layers 121, 122, 123, and 124 and the plurality of second wiring layers 221, 222, and 223 may refer to average values of pitches of each of the wiring layers rather than pitches of each of the wiring layers. That is, the meaning that the plurality of second wiring layers 221, 222, and 223 of the connection structure 200 have the relatively finer pitch than the plurality of first wiring layers 121, 122, 123, and 124 of the printed circuit board 100 is that an average value of each pitch in the plurality of second wiring layers 221, 222, and 223 may be smaller than that of each pitch in the plurality of first wiring layers 121, 122, 123, and 124.

For example, a first pitch may be greater than a second pitch in which the first pitch is an average pitch of at least one of the plurality of first wiring layers 121, 122, 123, and 124 of the printed circuit board 100, and the second pitch is an average pitch of at least one of the plurality of second wiring layers 221, 222, and 223 of the connection structure 200.

As another example of the high-density circuits, a first interval may be greater than a second interval in which the first interval is an average between the plurality of first wiring layers 121, 122, 123, and 124 of the printed circuit board 100, and the second interval is an interval between the plurality of second wiring layers 221, 222, and 223 of the connection structure 200. Here, the interval may refer to an interval between respective wiring layers in the plurality of first wiring layers 121, 122, 123, and 124 and the plurality of second wiring layers 221, 222, and 223.

Other contents overlap those described above, and a detailed description thereof is thus omitted.

Figure 4:
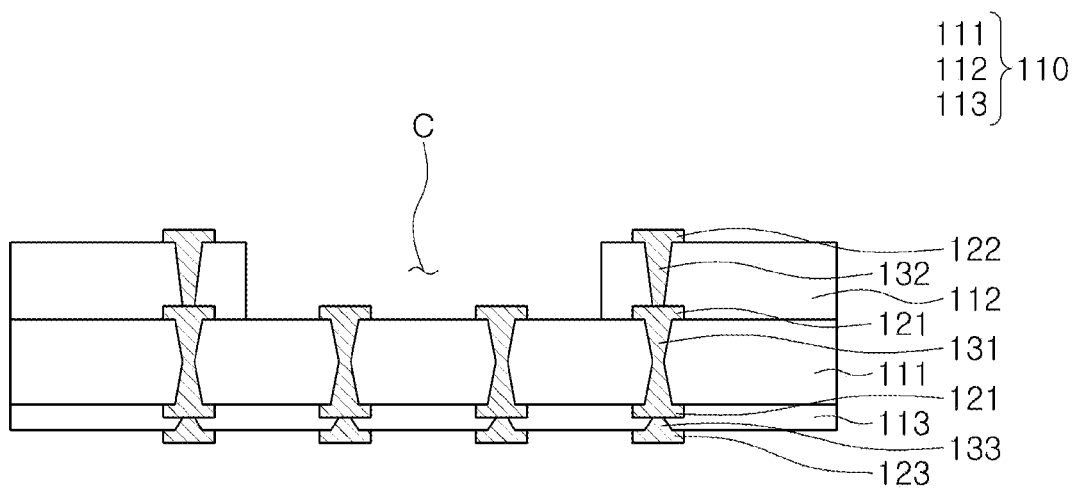
FIG. 4 is a schematic cross-sectional view illustrating a precursor of a printed circuit board in which a connection structure of FIG. 3 may be embedded.

FIG. 4 is a schematic cross-sectional view illustrating a precursor of a printed circuit board in which a connection structure of FIG. 3 may be embedded.

As illustrated in FIG. 4, the precursor of the printed circuit board 100 may be manufactured. First, the 1-2-th and 1-3-th insulating layers 112 and 113, the 1-2-th and 1-3-th wiring layers 122 and 123, and the 1-2-th and 1-3-th via layers 132 and 133 may be formed, respectively, on and beneath the 1-1-th insulating layer 111 which has one surface and the other surface on which the 1-1-th wiring layers 121 are disposed and in which the 1-1-th via layer 131 is formed, through a double-sided build-up process. Meanwhile, processes of manufacturing the connection structure-embedded substrate 500A of FIG. 3 will hereinafter be described on the basis of a double-sided build-up process of a printed circuit board including a core layer, but the printed circuit board 100 may be a coreless board, the connection structure-embedded substrate 500A may be manufactured by a onesided build-up process rather than the double-sided build-up process and may have a coreless board structure separated into two portions after the double-sided build-up process.

Thereafter, the 1-2-th insulating layer 112 may be processed to process the cavity C. A method of processing the cavity C is not limited, and may be a general processing method such as laser processing or blast processing.

At the time of processing the cavity C, a part of the 1-1-the wiring layer 121 disposed in the cavity C may protrude and be exposed into the cavity C. Meanwhile, it is obvious that a wiring layer is not exposed into the cavity C at the time of processing the cavity C in a region where the 1-1-th wiring layer 121 is not disposed.

Figure 5:
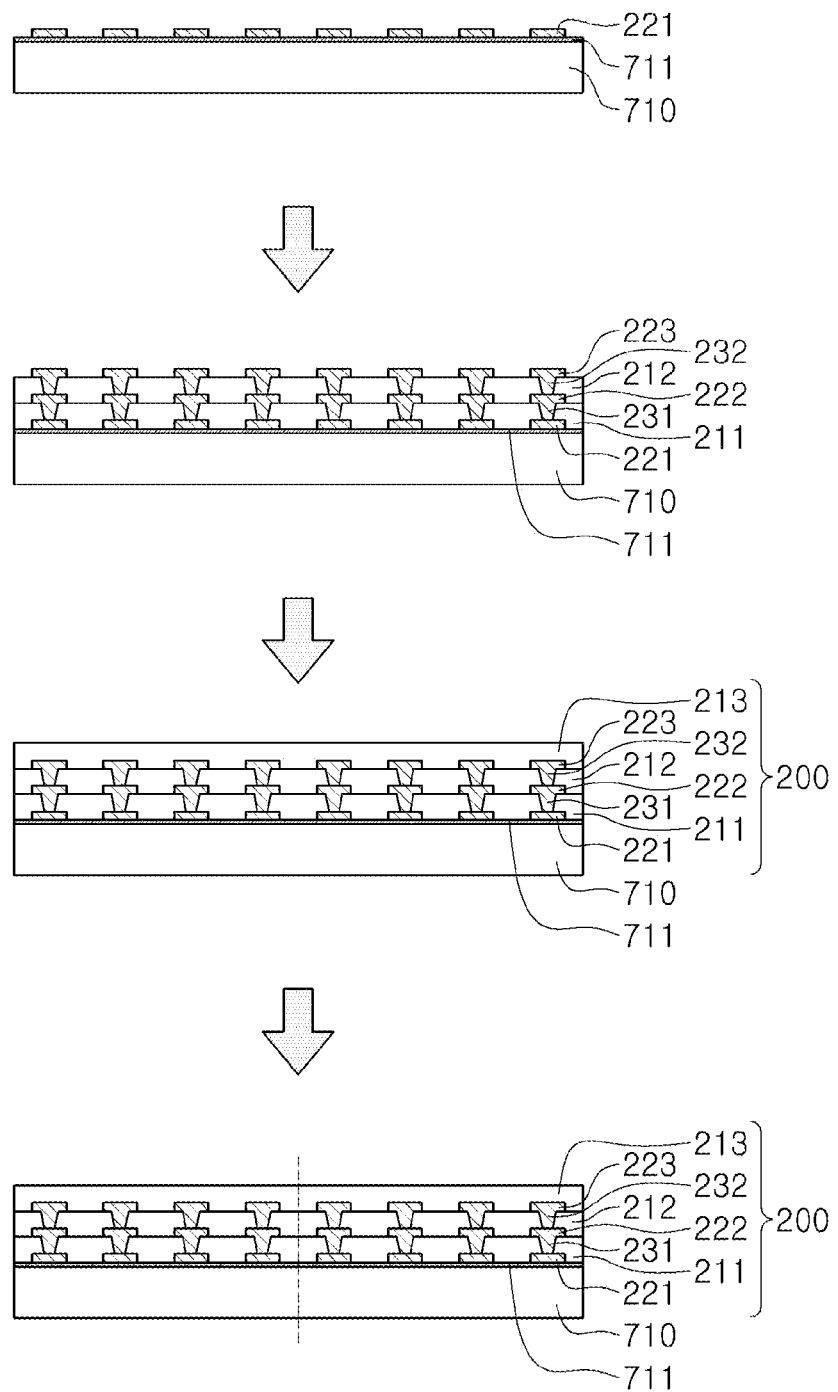
FIG. 5 is schematic views illustrating an example of processes of manufacturing the connection structure-embedded in the connection structure-embedded substrate of FIG. 3.

FIG. 5 is schematic views illustrating an example of processes of manufacturing the connection structure-embedded in the connection structure-embedded substrate of FIG. 3.

Referring to FIG. 5, a carrier 710 having a seed layer 711 formed on at least one surface thereof may be first prepared. Next, the plurality of second insulating layers 211, 212, and 213, the plurality of second wiring layers 221, 222, and 223, and the plurality of second via layers 231 and 232 may be formed on the seed layer 711 of the carrier 710. Each of the plurality of second insulating layers 211, 212, and 213 can be formed by applying and hardening an insulating material or stacking and hardening an insulating film. Each of the plurality of second wiring layers 221, 222, and 223 may be formed through a plating process. Each of the plurality of second via layers 231 and 232 may be formed by drilling a via hole through a photolithography process or the like, and then performing a plating process. Next, a laminate may be sawn with the carrier 710 attached thereto, and a unit laminate, that is, the connection structure 200 may be completed.

FIGS. 6 to 10 are schematic views illustrating an example of processes of manufacturing the connection structure-embedded substrate of FIG. 3.

Figure 6:
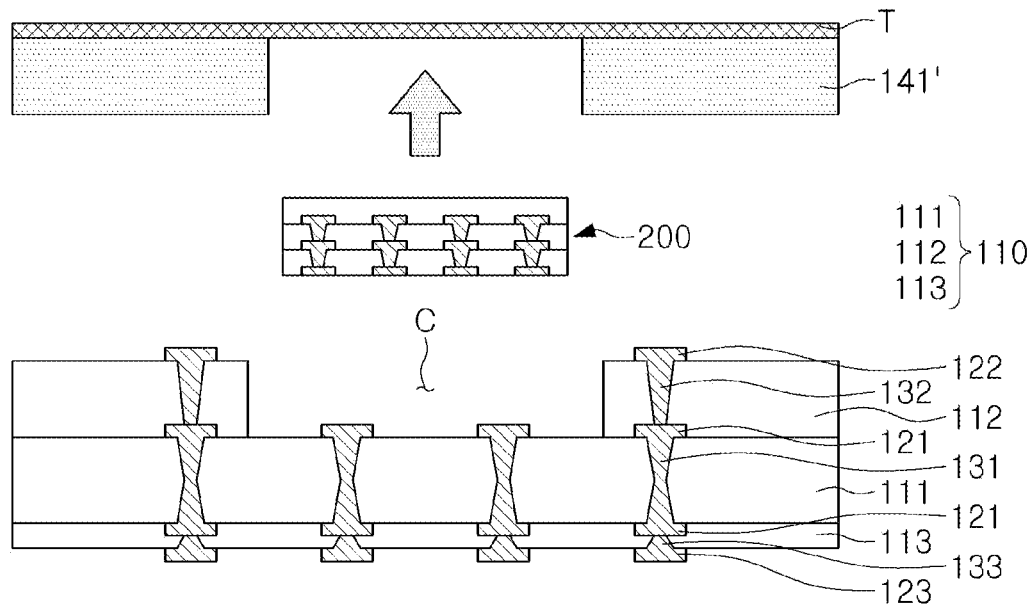
FIGS. 6 to 10 are schematic views illustrating an example of processes of manufacturing the connection structure-embedded substrate of FIG. 3.

Referring to FIG. 6, the precursor 141' of the first build-up insulating layer may be attached to one surface of the tape T. In this case, the precursor 141' of the first build-up insulating layer may be punched to be disposed in a region other than a space in which the connection structure 200 is to be embedded. Thereafter, the connection structure 200 manufactured through the processes of FIG. 5 may be disposed in the punched precursor 141' of the first build-up insulating layer and be attached to one surface of the tape T.

Figure 7:
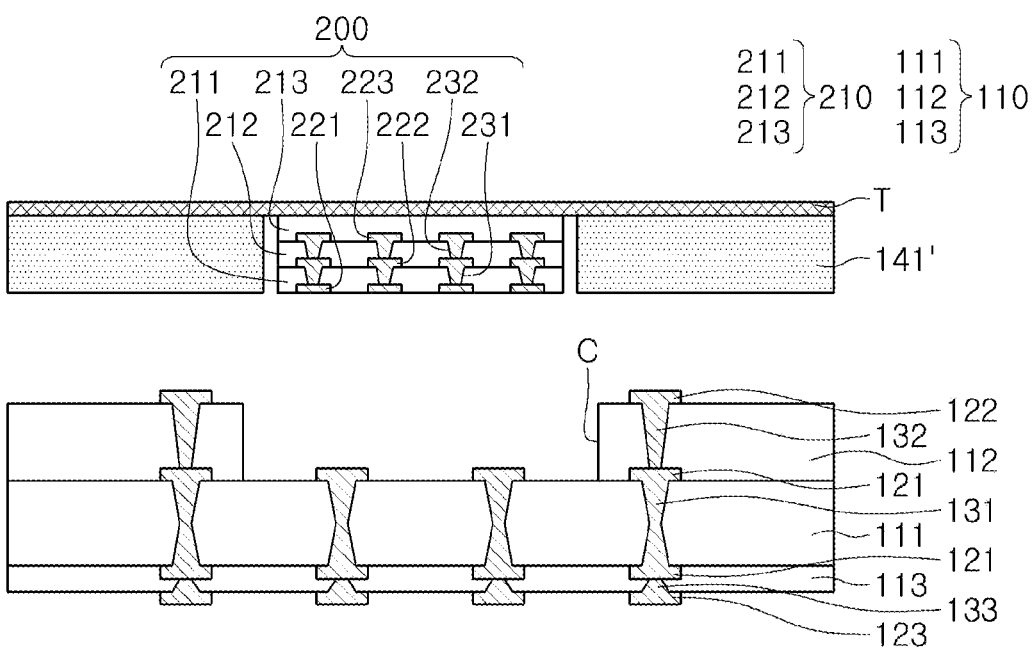

Thereafter, as illustrated in FIG. 7, the tape T having one surface to which the precursor 141' of the first build-up insulating layer and the connection structure 200 are attached may be bonded to the precursor of the printed circuit board in which the cavity C is formed. Since the connection structure 200 is disposed in the cavity C in a state in which the 2-3-th insulating layer 213 disposed at the uppermost side of the connection structure 200 is attached to the tape T, the 1-2-th via layer 132 of the printed circuit board 100 and the plurality of second via layers 231 and 232 of the connection structure 200 may have shapes tapered toward the same direction.

Figure 8:
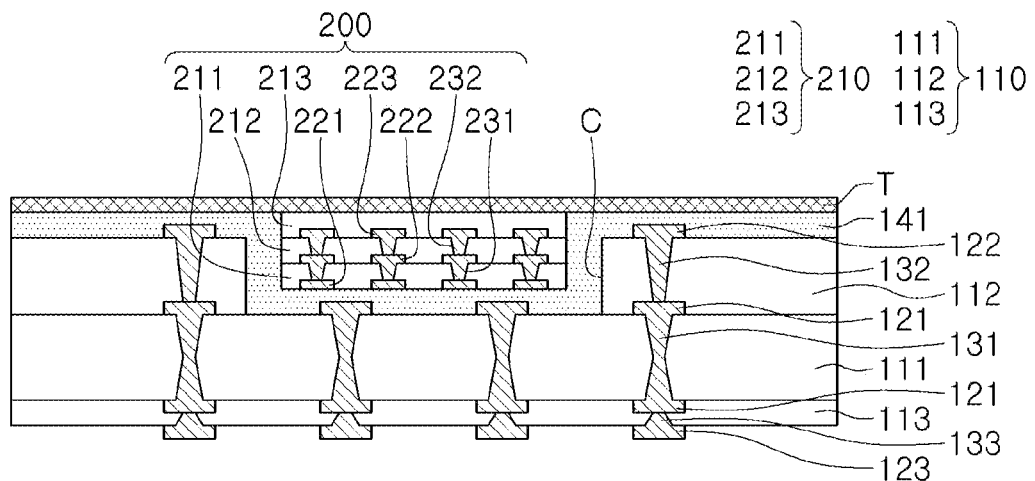

Referring to FIG. 8, the precursor 141' of the first build-up insulating layer, the connection structure 200, and the precursor of the printed circuit board may be heated and compressed so that at least a portion of the connection structure 200 is embedded in the cavity C.

In this case, in a high-temperature heating and compressing process, the precursor 141' of the first build-up insulating layer may have fluidity, and the precursor 141' of the first build-up insulating layer having the fluidity may flow into the cavity C to fill the surplus space in the cavity C in which the connection structure 200 is not disposed. Thereafter, the first build-up insulating layer 141 may be fixed through a temperature decreasing or hardening treatment. As a result, the connection structure 200 may be stably fixed in the first build-up insulating layer 141 without using a separate adhesive.

In addition, when the 1-1-th wiring layer 121 is disposed to be exposed into the cavity C, the first build-up insulating layer 141 having the fluidity may be hardened in a state in which it covers the 1-1-th wiring layer 121, thereby covering an upper surface and side surfaces of the 1-1-th wiring layer 121.

Figure 9:
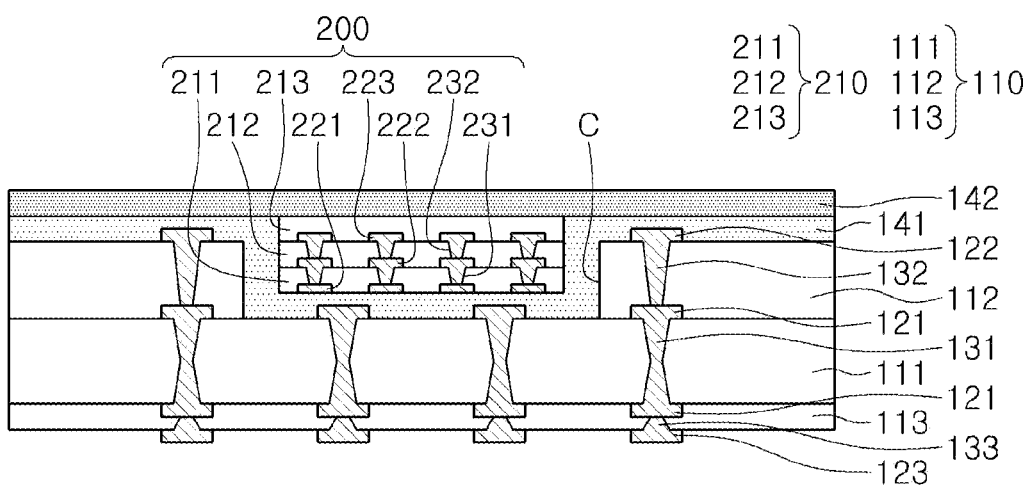

Next, as illustrated in FIG. 9, the tape T may be peeled off, and the second build-up insulating layer 142 may be stacked on exposed one surface of the first build-up insulating layer 141 and the exposed upper surface of the connection structure 200. In this case, one surface of the first build-up insulating layer 141 and the upper surface of the connection structure 200 may be coplanar with each other. Here, "coplanar" may mean that the upper surface of the connection structure 200 and one surface of the first build-up insulating layer 141 are horizontal to each other as a whole or the upper surface of the connection structure 200 and the one surface of the first build-up insulating layer 141 have a structure in which they are disposed to be disposed continuously in a horizontal direction or a structure similar thereto even though the upper surface of the connection structure 200 and the one surface of the first build-up insulating layer 141 are not horizontal to each other as a whole.

Figure 10:
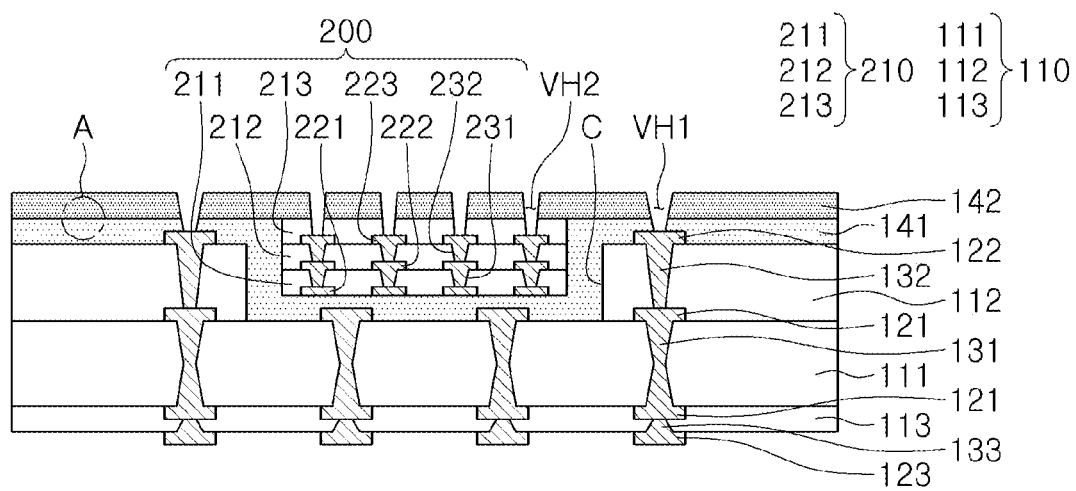

Thereafter, as illustrated in FIG. 10, first via holes VH1 penetrating through at least parts of each of the first and second build-up insulating layers 141 and 142 and second via holes VH2 penetrating through at least parts of each of the second build-up insulating layer 142 and the 2-3-th insulating layers 213 may be drilled.

A method of drilling the first and second via holes VH1 and VH2 may be a general method of drilling a via hole using a $CO_2$ laser, a YAG laser or the like.

The first via holes VH1 may penetrate through at least parts of each of the first and second build-up insulating layers 141 and 142 and externally expose parts of the 1-2-th wiring layer 122, and the second via holes VH2 may penetrate through at least parts of each of the second build-up insulating layer 142 and the 2-3-th insulating layer 213 and externally expose parts of the 2-3rd wiring layer 223.

Thereafter, a structure of the connection structure-embedded substrate 500A illustrated in FIG. 3, including the 1-4-th via layers 134 filling the first via holes VH1, the wiring vias V1 filling the second via holes VH2, and the 1-4-th wiring layers 124 disposed on the second build-up insulating layer 142 may be completed through a plating process of wiring layers and via layers such as the AP, the SAP, the MSAP, or the TT described above and a patterning process.

Figure 11:
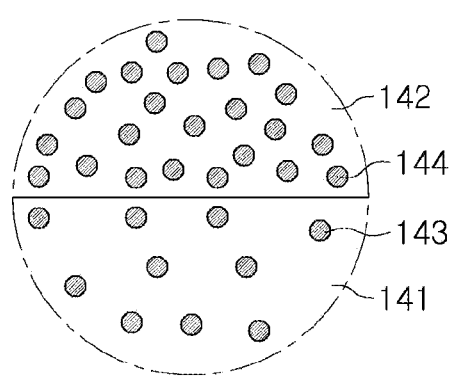
FIG. 11 is a partially enlarged view of region A of a printed circuit board of FIG. 10.

FIG. 11 is a partially enlarged view of region A of a printed circuit board of FIG. 10.

As illustrated in FIG. 11, the first and second build-up insulating layers 141 and 142 may include the fillers 143 and 144, respectively. In this case, a density of the fillers 144 in the second build-up insulating layer 142 may be relatively higher than that of the fillers 143 in the first build-up insulating layer 141.

In the present disclosure, "density" may be considered as a content or a volume ratio of a corresponding component per unit volume, as described above. For example, a content of the fillers 144 per unit volume of the second build-up insulating layer 142 may be higher than that of the fillers 143 per unit volume of the first build-up insulating layer 141. In another example, "density" may be considered as a content or an area ratio of a corresponding component per unit area in a cross-section cut, as described above. In this case, a content of the fillers 144 per unit area of the second build-up insulating layer 142 may be higher than that of the fillers 143 per unit area of the first build-up insulating layer 141 in a cross-section cut of the printed circuit board cutting both the second build-up insulating layer 142 and the first build-up insulating layer 141.

Other contents overlap those described above, and a detailed description thereof is thus omitted.

Figure 12:
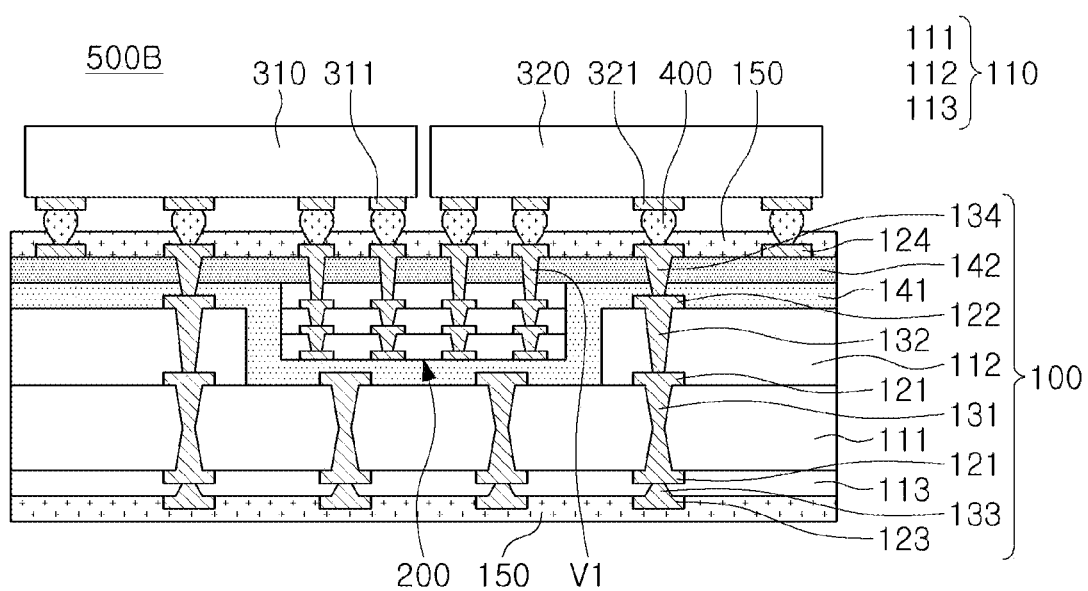
FIG. 12 is a schematic cross-sectional view illustrating a modified example of the connection structure-embedded substrate of FIG. 3.

FIG. 12 is a schematic cross-sectional view illustrating a modified example of the connection structure-embedded substrate of FIG. 3.

Referring to FIG. 12, a connection structure-embedded substrate 500B according to a modified example may be the same as the connection structure-embedded substrate 500A according to the exemplary embodiment described above except that a solder resist layer 150 having openings may be additionally disposed on an outer layer of the printed circuit board 100. At least parts of the first wiring layer disposed on the outermost layer of the printed circuit board may be exposed through the openings, and referring to FIG. 12, at least parts of the 1-4-th wiring layer 124 may be exposed externally of the printed circuit board 100. In addition, a plurality of electronic components 310 and 320 may be surface-mounted and disposed on the printed circuit board 100 through bumps 311 and 321, electrical connection metals 400 and the like.

According to the connection structure-embedded substrate 500B according to the modified example, the plurality of electronic components 310 and 320 may be connected to each other by the connection structure 200, such that a signal transmission distance may be shortened, and signal loss at the time of transferring signals may thus be reduced. In addition, the plurality of electronic components 310 and 320 may be connected to each other through the connection structure 200 corresponding to a microcircuit board, and advantages of the microcircuit that a high-speed signal transfer is possible and a signal transfer distance is shortened may thus be maintained.

At least parts of each of the plurality of electronic components 310 and 320 may be electrically connected to each other through the connection structure 200. The plurality of electronic components 310 and 320 may be an integrated circuit (IC) die provided in an amount of several hundred to several million or more elements integrated in a single chip. The plurality of electronic components 310 and 320 may further include a chip-type inductor, a chip-type capacitor or the like, in addition to the IC die, if necessary. The bumps 311 and 321 may include a metal such as copper (Cu). The electrical connection metals 400 may include tin (Sn) or an alloy containing tin (Sn), such as a solder.

Other contents overlap those described above, and a detailed description thereof is thus omitted.

As set forth above, according to an exemplary embodiment in the present disclosure, the connection structure may be embedded in the board without using a separate adhesive for bonding the connection structure.

In addition, a connection structure-embedded substrate having improved warpage control characteristics may be provided.

Further, a connection structure-embedded substrate in which electrical characteristics at the time of die-to-die high-speed signal transmission may be improved may be provided.

While exemplary embodiments have been shown and described above, it will be apparent to those skilled in the art that modifications and variations could be made without departing from the scope of the present invention as defined by the appended claims.

What is claimed is:

1. A connection structure-embedded substrate comprising:
   a printed circuit board including a plurality of first insulating layers of which at least one has a cavity provided therein, a plurality of first wiring layers disposed as at least one of an outer portion and an inner portion of the plurality of first insulating layers, a first build-up insulating layer disposed on an upper surface of the plurality of first insulating layers, and a second build-up insulating layer disposed on the first build-up insulating layer; and
   a connection structure at least partially disposed in the cavity and including a plurality of second insulating layers and a plurality of second wiring layers disposed as at least one of an outer portion and an inner portion of the plurality of second insulating layers,
   wherein the first build-up insulating layer is disposed in the cavity,
   each of a lower surface of the connection structure and a side surface of the connection structure connected to the lower surface of the connection structure is in contact with a same material of the first build-up insulating layer, respectively,
   the printed circuit board further includes a plurality of first via layers,
   one via of the plurality of first via layers penetrates a portion of the first build-up insulating layer, and has a tapered shape tapered in a direction from an upper surface of the first build-up insulating layer towards the plurality of first insulating layers,
   the second build-up insulating layer is disposed also on the connection structure, and has a coefficient of thermal expansion lower than that of the first build-up insulating layer, and
   a first pitch is greater than a second pitch in which the first pitch is a pitch of at least one of the plurality of first wiring layers, and the second pitch is a pitch of at least one of the plurality of second wiring layers.

2. The connection structure-embedded substrate of claim 1, wherein the first and second build-up insulating layers include fillers, respectively, and
   a density of the fillers per unit volume in the second build-up insulating layer is higher than that of the fillers per unit volume in the first build-up insulating layer.

3. The connection structure-embedded substrate of claim 1, wherein the first and second build-up insulating layers include fillers, respectively, and
   a density of the fillers per unit area in the second build-up insulating layer is higher than that of the fillers per unit area in the first build-up insulating layer.

4. The connection structure-embedded substrate of claim 1, wherein
   the one via of the plurality of first via layers also penetrates a portion of the second build-up insulating layer.

5. The connection structure-embedded substrate of claim 1, wherein the connection structure further includes a wiring via penetrating through one of the plurality of second insulating layers and the second build-up insulating layer.

6. The connection structure-embedded substrate of claim 1, wherein the lower surface of the cavity and the connection structure are disposed to be spaced apart from each other.

7. The connection structure-embedded substrate of claim 1, wherein the first build-up insulating layer is in contact with at least a portion of the lower surface of the cavity.

8. The connection structure-embedded substrate of claim 1, wherein the first build-up insulating layer has a step in a region in contact with the connection structure.

9. The connection structure-embedded substrate of claim 1, wherein at least a portion of one layer of the plurality of first wiring layers is spaced apart from the lower surface of the connection structure and is disposed on the lower surface of the cavity.

10. The connection structure-embedded substrate of claim 1, further comprising a plurality of electronic components disposed on the printed circuit board,
wherein at least parts of each of the plurality of electronic components are connected to each other through the connection structure.

11. The connection structure-embedded substrate of claim 1, wherein the plurality of second insulating layers include an organic insulating material.

12. A connection structure-embedded substrate comprising:
a printed circuit board including a first insulating body having a cavity provided in at least a portion thereof, a plurality of first wiring layers disposed on at least one of an outer portion and an inner portion of the first insulating body, a first build-up insulating layer disposed on the first insulating body, and a second build-up insulating layer disposed on the first build-up insulating layer; and
a connection structure at least partially embedded in the cavity and including a second insulating body and a plurality of second wiring layers disposed on at least one of an outer portion and an inner portion of the second insulating body,
wherein a same material of the first build-up insulating layer is disposed in the cavity and on the first insulating body,
the first and second build-up insulating layers include different insulating materials,
the second build-up insulating layer is disposed on the connection structure to be in contact with the connection structure,
the second build-up insulating layer is disposed also on the connection structure, and has a coefficient of thermal expansion lower than that of the first build-up insulating layer, and
a first pitch is greater than a second pitch in which the first pitch is a pitch of at least one of the plurality of first wiring layers, and the second pitch is a pitch of at least one of the plurality of second wiring layers.

13. The connection structure-embedded substrate of claim 12, wherein a dissipation factor (Df) of the second build-up insulating layer is lower than that of the first build-up insulating layer.

14. The connection structure-embedded substrate of claim 12, wherein the connection structure is disposed to be spaced apart from a lower surface of the cavity with the first build-up insulating layer interposed therebetween.

15. The connection structure-embedded substrate of claim 12, wherein a part of at least one layer of the plurality of first wiring layers is disposed between a lower surface of the cavity and the connection structure.

16. A connection structure-embedded substrate comprising:
a printed circuit board including first insulating layers and first wiring layers disposed in or on the first insulating layers, one of the first insulating layers having a cavity extending from an upper surface of the one of the first insulating layers; and
a connection structure at least partially disposed in the cavity, and including an upper surface, a lower surface opposing the upper surface, and a side surface connected to the upper surface and the lower surface of the connection structure, the connection structure including a plurality of second insulating layers and a plurality of second wiring layers disposed in or on the plurality of second insulating layers,
wherein the printed circuit board further includes a first build-up insulating layer and a second build-up insulating layer disposed on the connection structure and the first build-up insulating layer,
a same material of the first build-up insulating layer covers a portion of the upper surface of the one of the first insulating layers, and the side surface and the lower surface of the connection structure,
the upper surface of the connection structure is spaced apart from the first build-up insulating layer,
the second build-up insulating layer has a coefficient of thermal expansion lower than that of the first build-up insulating layer, and
a first pitch is greater than a second pitch in which the first pitch is a pitch of at least one of the plurality of first wiring layers, and the second pitch is a pitch of at least one of the plurality of second wiring layers.

17. The connection structure-embedded substrate of claim 16, wherein the printed circuit board further includes:
an upper wiring layer disposed on the second build-up insulating layer;
a first upper via disposed in the first build-up insulating layer and the second build-up insulating layer and connecting the upper wiring layer and one of the first wiring layers disposed on the one of the first insulating layers to each other; and
a second upper via disposed in the second build-up insulating layer and connecting the upper wiring layer and the connection structure to each other.

18. The connection structure-embedded substrate of claim 17, wherein the first upper via and the second upper via have a tapered shape tapered in a direction the same as a via disposed in the one of the first insulating layers.

19. The connection structure-embedded substrate of claim 17, wherein the second upper via is disposed also in one of the second insulating layers of the connection structure.

20. The connection structure-embedded substrate of claim 17, wherein the first and second build-up insulating layers include fillers, respectively, and
a density of the fillers per unit area in the second build-up insulating layer is higher than that of the fillers per unit area in the first build-up insulating layer.

21. The connection structure-embedded substrate of claim 17, wherein a dissipation factor (Df) or a dielectric constant (Dk) of the second build-up insulating layer is less than that of the first build-up insulating layer.

22. The connection structure-embedded substrate of claim 17, wherein one of the first insulating layers is a core layer having a thickness greater than a thickness of each of the other first insulating layers, and the cavity exposes a portion of the core layer.

23. The connection structure-embedded substrate of claim 22, wherein the cavity exposes a portion of one of the first wiring layers disposed on the core layer.

* * * * *